United States Patent
Nakatsuka et al.

(10) Patent No.: US 8,020,747 B2
(45) Date of Patent: Sep. 20, 2011

(54) SOLDERING METHOD AND SOLDERING APPARATUS

(75) Inventors: Tetsuya Nakatsuka, Fujisawa (JP); Masato Nakamura, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/498,909

(22) Filed: Jul. 7, 2009

(65) Prior Publication Data

US 2010/0006624 A1  Jan. 14, 2010

(30) Foreign Application Priority Data

Jul. 10, 2008  (JP) ................. 2008-180241

(51) Int. Cl.
*B23K 1/06* (2006.01)
(52) U.S. Cl. .................. 228/110.1; 228/102
(58) Field of Classification Search .......... 228/110.1, 228/102, 103, 111.5
See application file for complete search history.

(56) References Cited

U.S. PATENT DOCUMENTS

2009/0155958 A1 *  6/2009  Kolodin et al. ............. 438/120

FOREIGN PATENT DOCUMENTS

JP  2009-094370  4/2009

* cited by examiner

*Primary Examiner* — Jessica L Ward
*Assistant Examiner* — Nicholas P D'Aniello
(74) *Attorney, Agent, or Firm* — Foley & Lardner LLP

(57) ABSTRACT

Along with miniaturization of a solder connection portion in a bump repair or a local reflow, a void generated at the time of soldering remains in a solder to remarkably reduce connection strength, and there occurs a non-connection phenomenon in which the solder connection portion and a solder paste are melted, but are not fused with each other. During melting of a solder, a target component is clamped, ultrasonic oscillation is directly applied only to the target component. Further, start of solidification of the solder connection portion is detected by change of an electric impedance of a transducer while applying the ultrasonic oscillation, and the clamp is released before a substrate is warped.

7 Claims, 3 Drawing Sheets

SOLDERING METHOD AND SOLDERING APPARATUS

CLAIM OF PRIORITY

The present application claims priority from Japanese Patent Application 2008-180241 filed on Jul. 10, 2008, the content of which is hereby incorporated by reference into this application.

BACKGROUND OF THE INVENTION

The present invention relates to a reflow soldering method and a reflow soldering apparatus for realizing the same using a lead-free solder alloy which is low in toxicity but poor in wettability in general. The lead-free solder alloy can be applied to connection of a target component such as an electronic component to a circuit substrate such as an organic substrate, and is an alternative to an Sn-37Pb (unit: % by mass) solder used for soldering at around 220° C.

However, the lead-free solder alloy is generally poor in wettability as compared to the conventional Sn-37Pb solder, and especially in the case of an Sn—Zn solder, wetting of the solder is hardly spread on a connection member. As a result, stress is concentrated at a part where wetting is comparatively less spread, and the part becomes an early generation point of cracks, thus leading to deterioration in connection reliability in some cases.

In order to improve the wettability, the melting property of the solder is improved by increasing the fluidity of the solder, that is, the surface tension or kinetic viscosity of the solder at the time of melting is lowered.

As a method of solving the above-described problem, Patent Document 1 which is a previous application proposes a method in which ultrasonic oscillation is applied through a circuit substrate, and a melted solder is indirectly oscillated with high energy, though the oscillation is of minute amplitude, so that a void derived from an outgas of a flux (if the supplying amount of a flux is large, a gas remains in the solder) of a solder connection portion is discharged, or non-connection of melted solder bumps and a melted solder paste is prevented on a substrate basis.

Further, as a soldering method by locally heating only a solder connection portion or its surrounding portion, which is the main subject of the present invention, there is a method called as a bump repair in which in the case where an electronic component having solder bumps such as a BGA (Ball Grid Array) is poorly connected by reflow soldering, a solder connection portion of the electronic component is heated by hot air, the solder is melted to remove the electronic component, and the electronic component is soldered again.

SUMMARY OF THE INVENTION

However, the following points are not considered in the above-described proposal or method.

First, in Patent Document 1, JP-A No. 2009-094370, the method of indirectly applying the ultrasonic oscillation through the circuit substrate is less effective because the oscillation energy attenuates before reaching the solder connection portion. In addition, the print substrate is damaged according to the circumstances, and thus, the method can not always be used.

Further, along with miniaturization of the solder connection portion, the followings occur in the bump repair method in some cases. The void derived from the outgas of the flux generated at the time of soldering remains in the solder to remarkably reduce the connection strength, there occurs a non-connection phenomenon in which the solder bumps and solder paste are melted, but are not fused with each other, and the solder bumps and solder paste are apparently connected, but are not electrically connected.

Furthermore, even in the above-described local reflow method, the void residue in the solder and the non-connection phenomenon of the solder connection portion occur in some cases, as similar to the bump repair method.

As countermeasures against these problems, there is only one solution in which by heating the solder connection portion for a long time, avoid discharging probability or a probability of fusing melted solders with each other is increased.

However, if the solder connection portion is heated for a long time, the void remaining in the solder is hardly discharged in the case of a connection portion in which the solder for connection is shaped like a thin plate because electrodes on the target component side and those on the substrate side are close to each other and a connection area is large.

Therefore, the void residue in the solder is likely to occur in the connection portion of, especially, a BGA (Ball Grid Array) and an LGA (Land Grid Array).

Further, if the solder connection portion is heated for a long time, plastic deformation of the connection portion leads to reduction in thermal fatigue life thereafter, or the connection portion is distorted in shape whose stress is difficult to relax, thus leading to a short fatigue life in some cases.

A first object of the present invention is to prevent void discharge or void residue in the bumps, or non-connection in soldering or in miniaturized bump connection of a target component to be repaired, especially, in connection of a BGA or an LGA when a local reflow is performed even if there is used a lead-free solder which is large in surface tension as compared to a conventional Sn—Pb solder, and in which a void derived from an outgas of a flux is hardly discharged and melted solder bumps and a melted solder paste are hardly fused.

A second object of the present invention is to enable formation of a solder connection portion resistant to thermal fatigue after connection.

In order to achieve the above-described first object, a soldering method according to a first aspect of the present invention is characterized in that when soldering a solder connection portion of a target component with a substrate while applying heat energy thereto, ultrasonic oscillation is directly applied to the target component during melting of a solder while holding the target component.

In order to achieve the above-described first object, a soldering method according to a second aspect of the present invention includes: a first step of holding a target component; a second step of moving the target component to a position for soldering; a third step of applying heat energy to a solder connection portion of the target component at the position for soldering; and a fourth step of directly applying ultrasonic oscillation to the target component while the solder of the solder connection portion is melted.

In order to achieve the above-described first object, a soldering apparatus according to a third aspect of the present invention includes: a unit which holds a target component; a unit which applies heat energy to a solder connection portion of the target component with a substrate; and a unit which directly applies ultrasonic oscillation to the target component during melting of a solder.

In order to achieve the above-described second object, the soldering method having the first and second aspects according to a fourth aspect of the present invention is characterized in that start of solidification of the solder is detected, and the holding of the target component is released on the basis of a result of the detection.

In order to achieve the above-described second object, the soldering apparatus having the third aspect according to a fifth aspect of the present invention further includes a detecting unit which detects start of solidification of the solder.

According to the present invention, even if connection or miniaturized bump connection is performed by using a lead-free solder which is large in surface tension as compared to a conventional Sn—Pb solder, and in which a void derived from an outgas of a flux is hardly discharged and melted solder bumps and a melted solder paste are hardly fused, void discharge or void residue in the solder bumps of a repaired target component, or non-connection can be prevented when a local reflow is performed.

According to the present invention, a solder connection portion resistant to thermal fatigue after connection can be formed.

DESCRIPTION OF THE PREFERRED EMBODIMENTS

Figure 1:
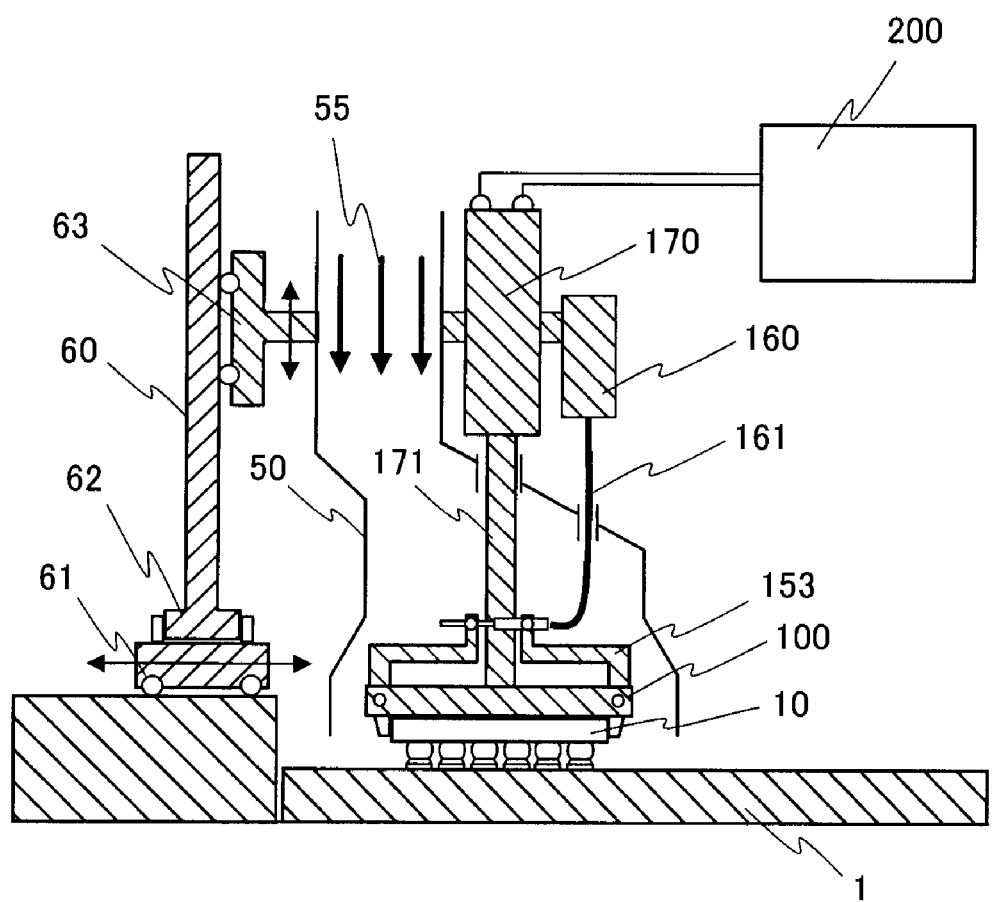
FIG. 1 is a diagram showing a first embodiment of the present invention in which bump connection such as BGA is performed.

Hereinafter, preferred embodiments will be described in detail with reference to FIG. 1 to FIG. 4. A local reflow apparatus is shown in FIG. 1. Oscillation is not applied through a circuit substrate 1, but ultrasonic oscillation is directly applied to a part of a target component such as the above-described BGA and LGA during melting of a solder as shown in FIG. 1.

In the apparatus representing a first embodiment shown in FIG. 1, in order to directly apply ultrasonic oscillation to a bump connection component BGA 10 to be connected to a circuit substrate 1, a transducer 170 is oscillated by an ultrasonic oscillator 200, and the ultrasonic oscillation is transmitted to a clamp 100 holding the BGA 10 through a sonotrode 171 by the oscillation. The BGA 10 is present in a heating hot-air nozzle 50, a solder is melted by a hot air 55 for soldering. On the other hand, the transducer 170 for generating ultrasonic waves is provided outside the heating hot-air nozzle 50 due to change of the frequencies of the ultrasonic waves generated and the insulating resistance and capacitance of the transducer itself caused by change of ambient temperature, so that the transducer 170 is protected from heat. The power of an actuator 160 is transmitted through a transmission cable 161 to open and close a click portion 153 of the clamp 100 by a controller (not shown) incorporated in the actuator 160, so that the clamp 100 holds the BGA 10. In addition, in order to protect the transducer 170 from heat, the heating hot-air nozzle 50 is provided with a minimum hole enough to pass the sonotrode 171 and the transmission cable 161. In order to move the clamp 100 to a desired position, a moving mechanism 60 including a right/left moving unit 61, a depth moving unit 62, and an up/down moving unit 63 is provided so as to move in the right and left directions, the depth directions, and the up and down directions.

Figure 2:
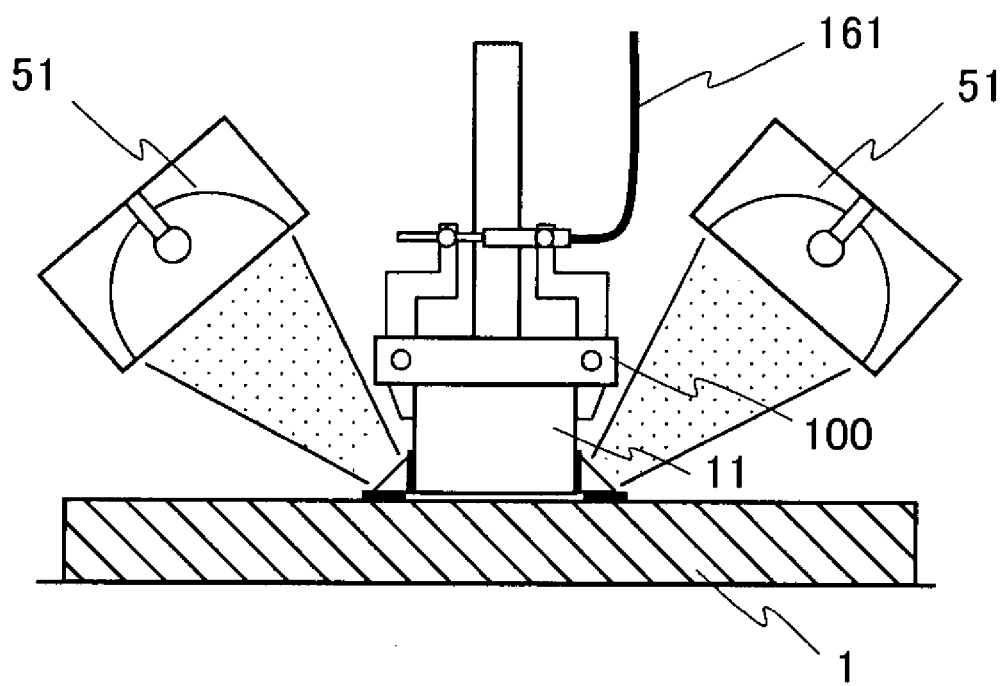
FIG. 2 is a diagram showing a second embodiment of the present invention in which a local reflow is performed by heating a solder connection portion with the beam of infrared ray or xenon light.

FIG. 2 shows an example applied to a local reflow machine in which the beam of a xenon lamp or an infrared ray lamp instead of the hot air 55 is irradiated onto a solder connection portion to melt the solder by heating, and the electric component 11 is soldered to the circuit substrate.

Next, the respective constituent elements of FIG. 1 and FIG. 2 will be described.

First, by the ultrasonic oscillator 200, a local speed difference can be generated in the solder with an oscillation frequency of about several 10 kHz, wave motion is easily diffracted around the connection portion, oscillation energy can be easily transmitted to ambient areas, and nonuniformity of energy transmission can be reduced.

Approximately 100 W or larger is necessary as an output from the ultrasonic oscillator 200, namely, electric power applied to the transducer. If the electric power is less than 100 W, the oscillation energy is attenuated in a component package or the like, and sufficient energy can not be transmitted to a melted solder portion of the connection portion, resulting in insufficient effects.

The sonotrode 171 of the ultrasonic oscillator and the clamp 100 coupled to the sonotrode 171 are designed so as to make the acoustic impedances as equal as possible. Accordingly, the oscillation energy is hardly reflected at a connection portion between the sonotrode 171 and the clamp 100.

Further, as the cable 161 which transmits a signal for releasing a target component to the clamp 100 holding the target component 10 or 11, it is preferable to use a cable which mechanically transmits the power because the structure thereof is not complicated.

Further, when the target component 10 or 11 is held by the clamp 100, approximately 100N to 150N is necessary as the holding power. If the holding power is small, the ultrasonic oscillation energy is not transmitted to the target component, or the target component 10 or 11 is detached from the clamp 100 in some cases. Therefore, a method using magnetic attraction or vacuum contact can not be used.

Figure 3:
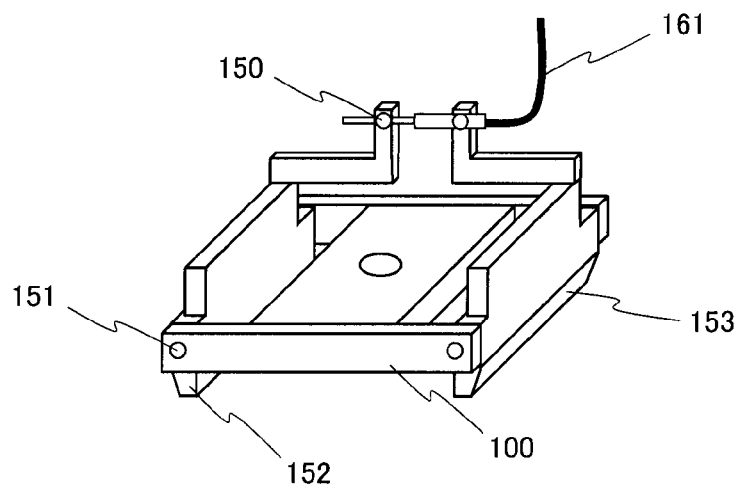
FIG. 3 is a diagram showing the first embodiment of a clamp according to the present invention.

Therefore, the clamp 100 is required to double its power by being configured as a leverage, in which a portion to which the power from actuator 160 is transmitted through the transmission cable 161 serves as a point of effect 150, the click portion 153 in contact with the target component 10 or 11 serves as an operating point 152, and a fulcrum 151 is provided therebetween, as shown in FIG. 3.

Accordingly, if the distance between the point of effect and the fulcrum is set sufficiently longer than the distance between the fulcrum and the operating point, even the actuator which is poor in power allows the clamp to hold the target component with strong power.

This means that the ultrasonic oscillation energy can be transmitted to the target component without a large loss.

Figure 4:
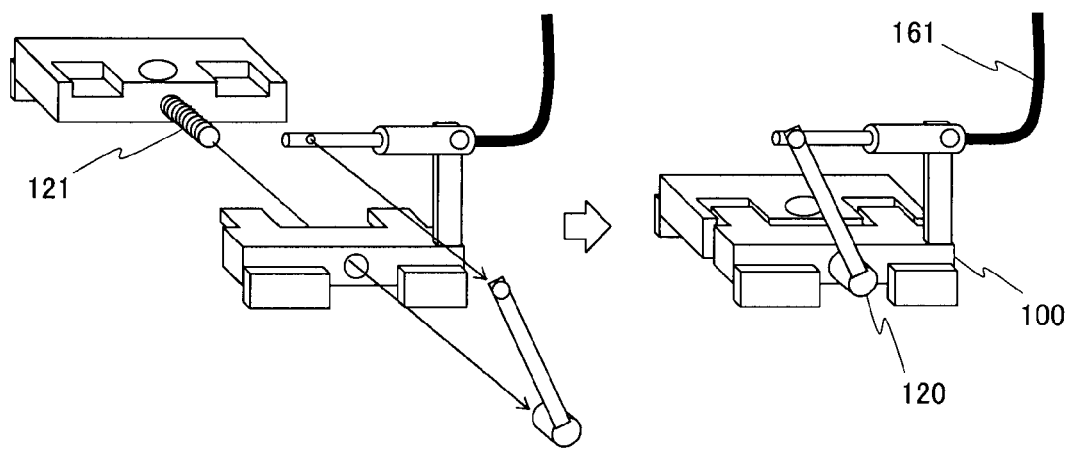
FIG. 4 is a diagram showing a second embodiment of a clamp according to the present invention in which in order to increase a force of holding a target component, a small force transmitted from a transmission cable is increased by using a screw or a worm gear.

Alternatively, as shown in FIG. 4, the target component may be held by doubling small power transmitted from the transmission cable 161 using the clamp formed by using a screw 120 and a worm gear 121.

Another merit obtained by adding the mechanism of doubling the power is that the cable itself can be made thinner because the power applied to the transmission cable can be made smaller and it is not necessary to increase the strength of the cable.

Accordingly, the actuator and the transmission cable can be downsized to the extent where they do not interfere with the hot-air nozzle having the same size as the target component of the repair apparatus or the like. Further, since the heat capacity of the cable can be made small, heating of the target component can be executed in a short time.

Further, in order to address the problems of reduction in the thermal fatigue life of the connection portion and the short thermal fatigue life due to long-time heating, the ultrasonic oscillator 200 is provided with an output change detecting unit for monitoring an output for output adjustment. If the solder of the connection portion is beginning to be solidified, the electric impedance of the transducer 170 viewed from the ultrasonic oscillator 200 is changed, so that the change is monitored by using the output of the ultrasonic oscillator 200.

The following description will clarify the way of addressing the above-described problems. In the case where the BGA or the like is connected, miniaturization (approximately 0.5 mm or less) of the size of the connection portion causes reduction in the curvature radius of the surface of the melted solder, thus increasing the surface energy of the solder.

Accordingly, a barrier from which a void escapes to the outside of the solder is formed on the surface of the solder, and an escaping probability is lowered. Thus, it is necessary to apply the ultrasonic oscillation for a certain period of time or longer (desirably, 20 seconds or longer) in a solder-melted state.

However, if the melting time of the solder becomes longer, a component of a substrate electrode such as copper is easily melted and saturated in the solder at the time of melting of the solder due to the small volume of the solder. Thus, a fragile Cu—Sn intermetallic compound layer is easily formed while having a large thickness at an interface between the solder and the electrode.

Since this layer causes reduction in the connection strength, the melting time is set only up to 40 seconds in the case of the connection portion with a size of 0.5 mm. Thus, the ultrasonic oscillation has to be applied by utilizing the time.

Further, an outgas is continued to be generated from a flux while the temperature of the solder of the connection portion is risen by heating of the substrate. Therefore, it is necessary to start the ultrasonic oscillation after the temperature of the solder reaches its peak and starts to go down.

At this time, if the cooling speed of the solder largely varies, some of the solder connection potion will begin to melt before a desired ultrasonic oscillation time.

Further, immediately after the solidification starts, the substrate whose temperature reaches nearly a glass transition point after being cooled will begin to warp, which places a large burden on the position where the solder is partially solidified in the connected portion held by the clamp.

As a result, the void can be removed, but experience of plastic deformation of the connection portion leads to reduction in thermal fatigue life thereafter, or the connection portion is distorted in shape whose stress is difficult to relax, thus leading to a short fatigue life in some cases.

In order to prevent this, change of the way of transmission (acoustic impedance) of the ultrasonic energy to the solder due to starting of solidification of the solder is detected as change of the electric impedance of the transducer 170 by the oscillator. This means that an equivalent circuit of the transducer 170 is formed by arranging a resistance component and a capacitance component in parallel, and the resistance component is remarkably changed by the change of the way of transmission of the ultrasonic energy. If the acoustic impedance of the transducer 170 is changed, the output of the ultrasonic oscillator 200 is changed.

The clamp 100 is released by such an output change detecting unit before the warpage of the substrate, and the connected component follows the substrate which is beginning to warp.

In the embodiment, an initial output at the time of melting of the solder is monitored, and then change of the electric impedance of the transducer by approximately 5% is detected, so that a clamp release signal is supplied to the controller in the actuator 160. Accordingly, the solidification of the solder of the electric component connection portion can be detected at an initial stage, and the solder connection portion resistant to the thermal fatigue after connection can be formed.

However, the above-described 5% is an example, each of the threshold values for the solder and the circuit substrate 1, or the connection members such as the electronic components 10 and 11 depends on the acoustic velocity or density, the level of the acoustic impedance obtained by multiplying these values can be determined on the basis of the members, and the reflection or transmission rate of the ultrasonic waves at an interface between different kinds of members differs depending on the values of or a difference between the acoustic impedances of the members.

Thus, when the solder is beginning to solidify, the reflection rate of the ultrasonic waves is changed increasingly or decreasingly in some cases. Accordingly, it is necessary to detect the both cases of the increased and decreased change of the output value.

First Embodiment

As a repair apparatus for a miniaturized bump connection component such as a BGA, there was used one that directly applied an output of 100 W of ultrasonic oscillation after the target component was connected to the transducer with the clamp during melting of the solder, and a BGA with full-grid 256 bumps of 1.27 mm-pitch 4-column peripheral arrangement which was poorly connected was removed.

The BGA was connected by pasting a solder whose composition was the same as that of bumps of an Sn-9Zn solder, so that another BGA which was to be newly exchanged was provided with the bumps of the same Sn-9Zn solder and the BGA was connected again by pasting the Sn-9Zn solder.

At the time of reconnecting the BGA, the solder bumps and the solder paste were melted 30 seconds later after heating, and 20 seconds later thereafter, cooling of the connection portion by stopping the supply of the hot air and the ultrasonic oscillation for 10 seconds were started. The ultrasonic oscillation could be applied at any timing as long as the solder was in a melted state. However, it was most efficient when the void was completely discharged, namely, when the supply of the hot air was stopped. This can be similarly applied to the following embodiments.

The ultrasonic oscillation was applied to the BGA directly clamped through the transducer of the apparatus.

Further, the clamp was configured in such a manner that a portion to which the power (power level=about 15N) from the actuator that was operated with compressed air was transmitted through the transmission cable served as a point of effect, the click portion in contact with the target component served as an operating point, and a fulcrum was provided therebetween.

Further, the distance between the point of effect and the fulcrum was set tenfold the distance between the fulcrum and the operating point, and even the actuator which was small enough to be mounted in the repair apparatus allowed the clamp to hold the BGA with strong power.

Further, for comparison, there was prepared another substrate to which an output of 1 kW of ultrasonic oscillation was applied, through the print substrate, using another transducer for 10 seconds at the position apart from the BGA on the print substrate by 10 cm without operating the transducer of the apparatus.

100 substrates were produced in each of the both methods, and then an electric conduction check of the BGA connection portion was performed. The results showed that conductive defect was not observed in the case where an output of 100 W of ultrasonic oscillation was directly applied, whereas it was confirmed that conductive defect was observed in five substrates despite an output of 1 kW in the case where the ultrasonic oscillation was applied through the circuit substrate.

Second Embodiment

As a local reflow apparatus for a surface connection component such as a connector, there was used one that directly applied an output of 100 W of ultrasonic oscillation after the electric component was connected to the transducer with the clamp during melting of the solder, and a connector with 0.5 mm-pitch 50-leads was connected to a thin circuit substrate with a thickness of 0.8 mm by pasting an Sn-3Ag-0.5Cu solder.

At the time of connection, the solder paste was melted 25 seconds later after heating, and 20 seconds later thereafter, cooling of the connection portion by stopping the supply of the hot air and the ultrasonic oscillation for 10 seconds were started.

The ultrasonic oscillation was applied to the connector with 0.5 mm-pitch 50-leads directly clamped through the transducer of the apparatus.

Further, the clamp was configured in such a manner that a portion to which the power (power level=about 15N) from the actuator that was provided with the controller and operated with compressed air was transmitted through the transmission cable served as a point of effect, the click portion in contact with the target component served as an operating point, and a fulcrum was provided therebetween.

Further, the distance between the point of effect and the fulcrum was set tenfold the distance between the fulcrum and the operating point, and even the actuator which was small enough to be mounted in the repair apparatus allowed the clamp to hold the connector with strong power.

Further, for comparison, there was prepared another substrate to which an output of 1 kW of ultrasonic oscillation was applied, through the print substrate, using another transducer for 10 seconds from an end portion of the print substrate which was apart from the connector by 5 cm without operating the transducer of the apparatus.

100 substrates were produced in each of the both methods, and then an electric conduction check of the connector connection portion was performed. The results showed that conductive defect was not observed in the case where an output of 100 W of ultrasonic oscillation was directly applied, whereas it was confirmed that a conductive defect was observed in four substrates despite an output of 1 kW in the case where the ultrasonic oscillation was applied through the circuit substrate. The detailed observation of the connection portion showed that its cause was derived from poor wetting of the connector leads and the solder paste due to generation of the complicated warpage of the thin substrate.

Third Embodiment

As a repair apparatus for a miniaturized bump connection component such as a BGA, there was used one that directly applied an output of 100 W of ultrasonic oscillation after the target component was connected to the transducer with the clamp during melting of the solder, and a BGA with 1.0 mm-pitch full-grid 256 bumps which was poorly connected was removed.

The BGA was connected by pasting a solder whose composition was the same as that of bumps of an Sn-9Zn solder, so that another BGA which was to be newly mounted was provided with the bumps of the same Sn-9Zn solder and the BGA was connected again by pasting the Sn-9Zn solder.

At the time of reconnecting the BGA, the solder bumps and the solder paste were melted 30 seconds later after heating, and 20 seconds later thereafter, cooling of the connection portion by stopping the supply of the hot air and the ultrasonic oscillation for up to 20 seconds were started.

The ultrasonic oscillation was applied to the BGA directly clamped through the transducer of the apparatus.

Further, the clamp was configured in such a manner that a portion to which the power (power level=about 15N) from the actuator that was operated with compressed air was transmitted through the transmission cable served as a point of effect, the click portion in contact with the target component served as an operating point, and a fulcrum was provided therebetween.

Further, the distance between the point of effect and the fulcrum was set tenfold the distance between the fulcrum and the operating point, and even the actuator which was small enough to be mounted in the repair apparatus allowed the clamp to hold the BGA with strong power.

Further, the repair was started in the configuration where immediately after the ultrasonic oscillator detected that the electric impedance of the transducer was changed by approximately 5%, the clamp was released and the ultrasonic oscillation was stopped.

Further, for comparison, there was prepared another substrate to which the ultrasonic oscillation was applied for a certain period of 20 seconds with the output change detecting mechanism of the ultrasonic oscillator of the apparatus turned off.

100 substrates were produced in each of the both methods, and then an electric conduction check of the BGA connection portion was performed. The results showed that conductive defect was not observed in the case where immediately after the ultrasonic oscillator detected the output change, the clamp was released and the ultrasonic oscillation was stopped, whereas it was confirmed that conductive defect was observed in three substrates in the case where the ultrasonic oscillation was applied for a period of 20 seconds. The detailed observation of the connection portion showed that its cause was derived from the fact that the BGA package could not follow the warpage of the substrate in a state where parts of the solder bumps were not completely solidified although the solder was once connected, and the solder was divided into two during the solidification.

Fourth Embodiment

As a repair apparatus for a miniaturized bump connection component such as a BGA, there was used one that directly applied an output of 100 W of ultrasonic oscillation after the target component was connected to the transducer with the clamp during melting of the solder, and a BGA with 1.0 mm-pitch full-grid 256 bumps which was poorly connected was removed.

The BGA was connected by pasting a solder whose composition was the same as that of bumps of an Sn-9Zn solder, so that another BGA which was to be newly mounted was provided with the bumps of the same Sn-9Zn solder and the BGA was connected again by pasting the Sn-9Zn solder.

At the time of reconnecting the BGA, the solder bumps and the solder paste were melted 30 seconds later after heating, and 20 seconds later thereafter, cooling of the connection portion by stopping the supply of the hot air and the ultrasonic oscillation for up to 20 seconds were started.

The ultrasonic oscillation was applied to the BGA directly clamped through the transducer of the apparatus.

Further, the clamp was configured in such a manner that a portion to which the power (power level=about 15N) from the actuator that was operated with compressed air was transmitted through the transmission cable served as a point of effect, the click portion in contact with the target component served as an operating point, and a fulcrum was provided therebetween.

Further, the distance between the point of effect and the fulcrum was set tenfold the distance between the fulcrum and the operating point, and even the actuator which was small enough to be mounted in the repair apparatus allowed the clamp to hold the BGA with strong power.

Further, the repair was started in the configuration where immediately after the ultrasonic oscillator detected that the electric impedance of the transducer was changed by approximately 5%, the clamp was released and the ultrasonic oscillation was stopped.

100 substrates were produced in this method, and then an electric conduction check of the BGA connection portion was performed. The result showed that no conductive defect was observed.

Further, for comparison, a repaired substrate was supposed to be produced using a clamp in which the distance between the point of effect and the fulcrum was set twice, instead of tenfold, the distance between the fulcrum and the operating point, and the power of holding the BGA was reduced to one-fifth. However, the BGA was dropped off from the clamp as soon as the ultrasonic oscillation was started, and thus the production was abandoned.

The present invention can be applied, as a method of soldering by locally heating only a solder connection portion or its surrounding portion, to an existing process as a bump repair in which a solder connection portion of an electronic component is heated by hot-air to remove the electronic component by melting the solder and the electronic component is soldered again, or another existing process as a local reflow in which the beam of an infrared ray lamp or a xenon lamp is irradiated onto the solder connection portion for heating to melt the solder for soldering.

What is claimed is:

1. A soldering method, comprising:
    soldering a solder connection portion of a target component with a substrate while applying heat energy thereto and directly applying ultrasonic oscillation to the target component by a transducer during melting of a solder while holding the target component;
    cooling the solder connection portion;
    detecting start of solidification of the solder by the transducer; and
    releasing the target component based on of the detection.

2. The soldering method according to claim 1, wherein the detecting comprises detecting a change of an electric impedance of the transducer which oscillates ultrasonic waves.

3. The soldering method according to claim 1, wherein the detecting comprises detecting a change of power applied to the transducer which oscillates ultrasonic waves.

4. The soldering method according to claim 1, wherein the releasing is based in part on stopping application of heat energy.

5. The soldering method according to claim 1, wherein the target component is held at a holding power of approximately 150N.

6. A soldering method, comprising:
    holding a target component;
    moving the target component to a position for soldering;
    applying heat energy to a solder connection portion of the target component at the position for soldering;
    directly applying ultrasonic oscillation to the target component by a transducer while the solder of the solder connection portion is melted;
    cooling the solder connection portion; and
    detecting a start of solidification of the solder and releasing the holding of the target component based on of the detection.

7. The soldering method according to claim 1, wherein the ultrasonic oscillation is applied to the target component when a temperature of the solder is reducing.

* * * * *